(12) United States Patent
Poon et al.

(10) Patent No.: US 12,336,101 B2
(45) Date of Patent: Jun. 17, 2025

(54) CARD SUBSTRATE FOR CARRYING CHIP MODULE AND SMART CARD THEREOF

(71) Applicant: PARLEX (SHANGHAI) ELECTRONICS CO., LTD., Shanghai (CN)

(72) Inventors: Ngai Man Poon, Hong Kong (CN); Rong Zhang, Shanghai (CN); Yiqi Zhang, Shanghai (CN)

(73) Assignee: PARLEX (SHANGHAI) ELECTRONICS CO., LTD., Shanghai (CN)

( * ) Notice: Subject to any disclaimer, the term of this patent is extended or adjusted under 35 U.S.C. 154(b) by 225 days.

(21) Appl. No.: 18/128,230

(22) Filed: Mar. 30, 2023

(65) Prior Publication Data

US 2023/0240013 A1 Jul. 27, 2023

Related U.S. Application Data

(63) Continuation of application No. PCT/CN2021/118042, filed on Sep. 13, 2021.

(30) Foreign Application Priority Data

Sep. 30, 2020 (CN) .......................... 202011064735.2

(51) Int. Cl.
*H05K 1/18* (2006.01)
(52) U.S. Cl.
CPC ... *H05K 1/181* (2013.01); *H05K 2201/09036* (2013.01)
(58) Field of Classification Search
CPC .................................................... H05K 1/181

USPC ......................................................... 361/748
See application file for complete search history.

(56) References Cited

U.S. PATENT DOCUMENTS 6,513,718 B1 2/2003 Bouchez et al.
2021/0192311 A1* 6/2021 Lotya ............... G06K 19/07747

FOREIGN PATENT DOCUMENTS

| CN | 203325501 U | 12/2013 |
| CN | 206849823 U | 1/2018 |
| CN | 208992362 U | 6/2019 |
| CN | 209801161 U | 12/2019 |
| EP | 0339763 A2 | 11/1989 |
| JO | H03275394 * | 3/1990 |
| JP | H01263089 A | 10/1989 |

(Continued)

OTHER PUBLICATIONS

English translation of International Search Report from PCT/CN2021/118042 Dec. 8, 2021.

*Primary Examiner* — Stanley Tso
(74) *Attorney, Agent, or Firm* — Aird & McBurney LP

(57) ABSTRACT

The invention provides a card substrate for carrying a chip module, the card substrate has a first surface and a second surface opposite to the first surface, and a concave portion for accommodating the chip module, the concave portion includes a first concave portion, and a second concave portion further recessed from a bottom wall of the first concave portion, in a left-right direction, a size of the second concave portion gradually narrows from a middle to both sides, and in an up-down direction, the size of the second concave portion gradually narrows from the middle to both sides. The card substrate of the invention can provide good support and protect for the chip module.

15 Claims, 5 Drawing Sheets

(56) References Cited

FOREIGN PATENT DOCUMENTS

JP         H03275394    *   3/1990
JP         H03275394 A   12/1991

* cited by examiner

CARD SUBSTRATE FOR CARRYING CHIP MODULE AND SMART CARD THEREOF

FIELD OF THE INVENTION

The invention relates to the field of smart cards, in particular to a card substrate for carrying a chip module, and a smart card having the card substrate.

BACKGROUND OF THE INVENTION

Smart cards, also known as IC cards, intelligent cards, microcircuit cards, microchip module cards, etc., are widely used in payment cards, SIM cards, transportation cards, credit cards and other fields due to the characteristics of small size, easy to carry, large storage capacity, high reliability, long service life, strong confidentiality, and high security. The communication mode between the smart card and the reader can be either contact or contactless. When the contact smart card is in use, the integrated circuit of the card is directly connected to an external interface circuit through tangible metal electrode contacts, the power supply for the integrated circuit is provided and data exchange is performed. Since the chip module of the contactless smart card is electrically connected to the induction antenna inside the smart card through conductive materials such as solder paste, it only needs to be close to the card reader when using it, that is, the data can be read by remote sensing with the card reader through radio waves.

Whether it is a contact smart card or a contactless smart card, it includes a card substrate and a chip module accommodated in the card substrate, and it often needs to pass a three-roller tester (that is, use three rollers to squeeze the chip module to simulate reading devices such as bank deposit and withdrawal machines) for reliability test after the manufacturing is completed. However, some existing types of chip modules are relatively thin and soft. During the three-roller test, the chip modules are easily damaged and fail to pass the reliability test.

SUMMARY OF THE INVENTION

In view of this, the present invention aims to provide a card substrate for carrying a chip module that can solve or at least alleviate the above problems, and a smart card with the card substrate.

In one aspect, the present invention provides a card substrate for carrying a chip module, the card substrate comprises a first surface and a second surface opposite to the first surface, and a concave portion recessed from the first surface toward the second surface for accommodating the chip module, the concave portion comprising a first concave portion recessed from the first surface toward the second surface, and a second concave portion further recessed from a bottom wall of the first concave portion toward the second surface, in a left-right direction, a size of the second concave portion gradually narrows from the middle to both sides, and in an up-down direction, a size of the second concave portion gradually narrows from the middle to both sides, a first angle formed by a connecting line between a right end point and a upper end point of an outline of the second concave portion, and a connecting line between the right end point and a lower end point of the outline of the second concave portion is between 50 degrees and 80 degrees, a second angle formed by a connecting line between a left end point and the upper end point of the outline of the second concave portion, and a connecting line between the left end point and the lower end point of the outline of the second concave portion is also between 50 degrees and 80 degrees.

Preferably, a third angle is formed by a connecting line between the upper end point and the left end point of the outline of the second concave portion, and the connecting line between the upper end point and the right end point of the outline of the second concave portion, and the third angle is between 100 degrees and 130 degrees.

Preferably, a ratio of a distance between the left end point and the right end point of the outline of the second concave portion to a distance between the upper end point and the lower end point of the outline of the second concave portion is between 1.2 and 2.5.

Preferably, the outline of the second concave portion comprises two curved sections arranged along the left-right direction and connected with each other, each curved section comprises a first arc-shaped section substantially in the middle, and two second arc-shaped sections respectively connected to two ends of the first arc-shaped section.

Preferably, a central angle corresponding to the first arc-shaped section is between 81 degrees and 134 degrees, and a radius corresponding to the first arc-shaped section is between 0.4 mm and 1 mm.

Preferably, a central angle corresponding to the second arc-shaped section is between 16 degrees and 40 degrees, and a radius corresponding to the second arc-shaped section is between 3 mm and 7 mm Preferably, the curved section further comprise two straight sections respectively connected to ends of the two second arc-shaped sections away from the first arc-shaped section.

Preferably, a distance between the left end point and the right end point of the outline of the second concave portion is between 2.5 mm and 7.5 mm, and a distance between the upper end point and the lower end point of the outline of the second concave portion is between 2.5 mm and 5 mm.

Preferably, the outline of the second concave portion comprises two curved sections arranged along the left-right direction and connected with each other, the two curved sections together form a quadrilateral, each curved section comprises two straight sections, and the outline further comprises arc-shaped connecting sections for connecting adjacent straight sections.

Preferably, the outline of the second concave portion is substantially rhombus-shaped.

Preferably, the outline of the second concave portion is substantially rugby ball-shaped.

In another aspect, the present invention provides a smart card, the smart card comprising the aforementioned card substrate, and a chip module accommodated in the concave portion of the card substrate.

The outline of the second concave portion in the present invention is similar to two opposite triangles, so as to provide good support and protection for the chip module after the chip module is assembled on the card substrate provided by the invention. Even when performing the three-roller test, the chip will not absorb too much vibration and extrusion, which helps to improve the passing rate of the reliability test of the chip.

BRIEF DESCRIPTION OF THE DRAWINGS

Further features of the invention will become apparent from the following description of the preferred embodiments, the preferred embodiments are only provided by way of example with reference to the accompanying drawings, in which.

DETAILED DESCRIPTION OF THE PREFERRED EMBODIMENTS

Figure 1:
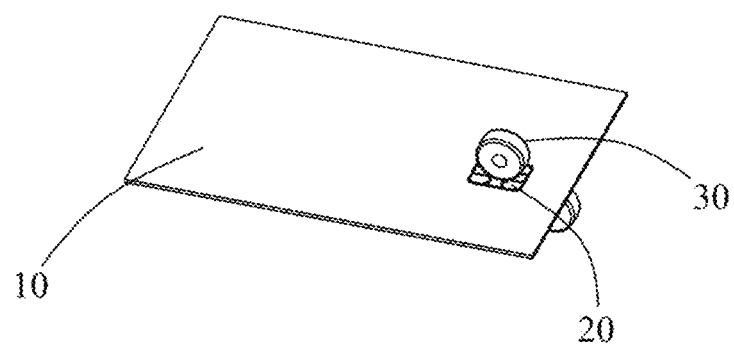
FIG. 1 is a perspective view of a smart card of the present invention carrying out a three-roller test.

The present invention will be described in detail below in conjunction with the accompanying drawings and specific embodiments, so as to make the technical solutions and beneficial effects of the invention clearer. It can be understood that the drawings are only provided for reference and description, and are not used to limit the present invention. The dimensions shown in the drawings are only for the convenience of clear description, and do not limit the proportional relationship.

Figure 2:
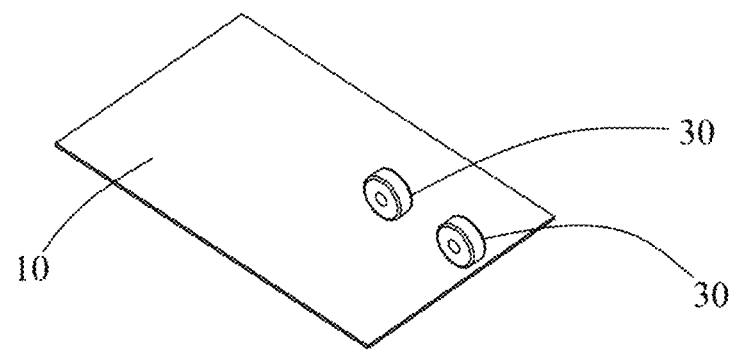
FIG. 2 is a perspective view of another angle of the smart card shown in FIG. 1 carrying out the three-roller test.
Figure 3:
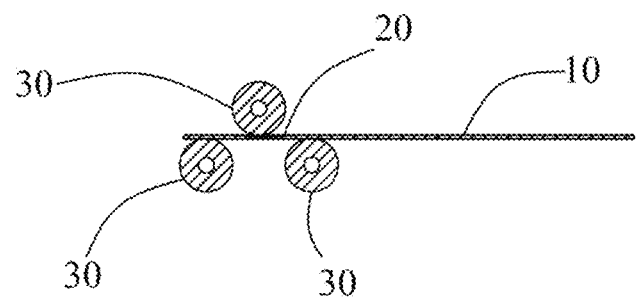
FIG. 3 is a sectional view of the smart card shown in FIG. 1 carrying out the three-roller test.

Referring to FIGS. 1 to 3, the smart card of the present invention includes a rectangular card substrate 10 and a chip module 20 housed in the card substrate 10. When the manufactured smart card of the present invention performs the three-roller test, one of the rollers 30 presses against a surface of the chip module 20, and the other two rollers 30 press at intervals against a surface of the card substrate 10 which is opposite to the chip module 20. During the test, each roller 30 rolls back and forth along a length direction of the card substrate 10 to simulate a reading device such as a bank machine, so as to conduct a reliability test on the chip module 20. In other words, the rolling direction of each roller 30 is consistent with the direction of inserting the smart card into a cash machine or the direction of taking out the smart card from the cash machine. It is worth noting that the smart card of the present invention can adopt both contact communication and contactless communication. When the contact communication is used, a metal layer of the chip module 20 for directly contacting with an external interface circuit is formed on an outer surface of the chip module 20 and is preferably flush with the surface of the card substrate 10.

Figure 4:
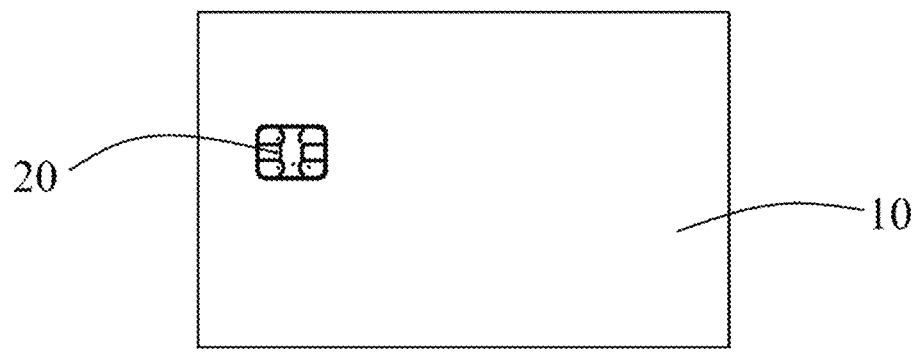
FIG. 4 is a top view of a smart card of a first embodiment of the present invention.
Figure 5:
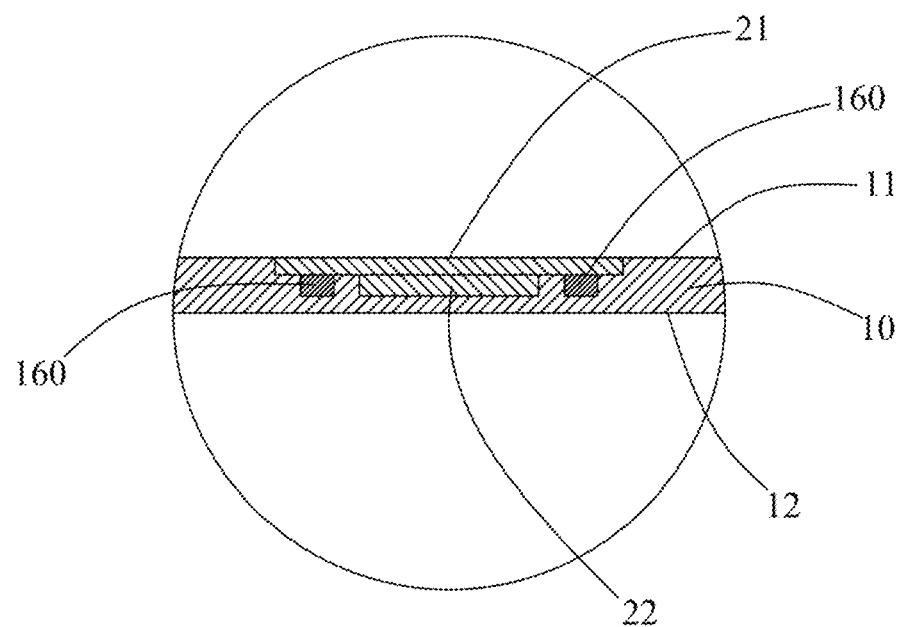
FIG. 5 is a partial sectional view of the smart card shown in FIG. 4.
Figure 6:
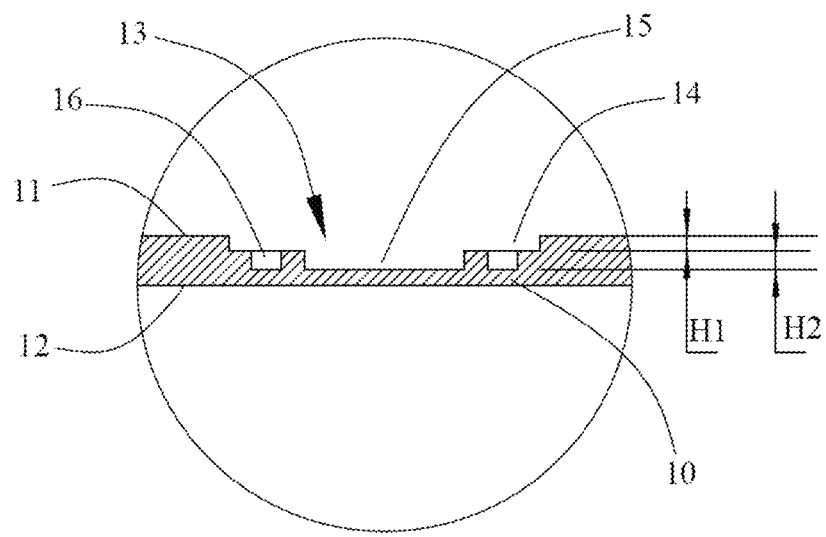
FIG. 6 is a partial sectional view of the card substrate of the smart card shown in FIG. 4.

Referring to FIGS. 4 to 6, the card substrate 10 of the smart card of the first embodiment of the present invention has a first surface 11 and second surface 12 opposite to the first surface 11, and a concave portion 13 recessed from the first surface 11 toward the second surface 12 for receiving the chip module 20. The concave portion 13 includes a first concave portion 14 recessed from the first surface 11 of the card substrate 10 toward the second surface 12 of the card substrate 10, and a second concave portion 15 further recessed from a bottom wall of the first concave portion 14 toward the second surface 12 of the card substrate 10. The first recess 14 is used to accommodate the substrate 21 of the chip module 20, and the second recess 15 is used to accommodate the chip 22 of the chip module 20, wherein the substrate 21 of the chip module 20 is electrically connected to the chip 22.

The smart card in this embodiment can realize contactless reading, and the card substrate 10 is further formed with two third concave portions 16 which further recess from the bottom wall of the first concave portion 14 toward the second surface 12 of the card substrate 10. The two third concave portions 16 are respectively located at both ends of the second concave portion 15 along the insertion direction of the smart card. The two third concave portions 16 contain conductive material 160, such as solder paste, for respectively connecting the positive and negative power electrodes of the chip module 20 and the antenna (not shown) arranged in the card substrate 10.

Figure 7A:
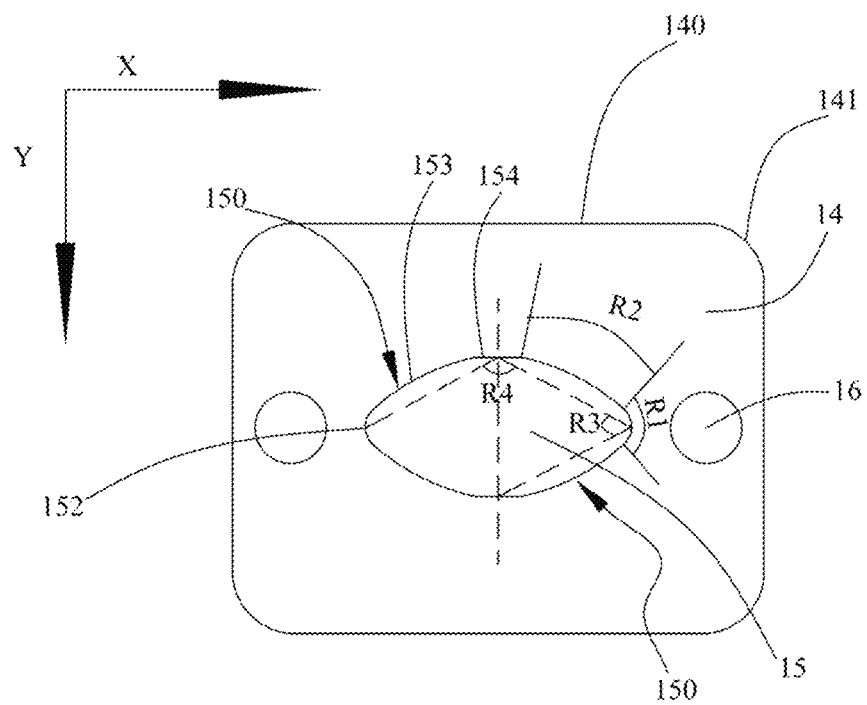
FIG. 7A is a partial top view of the card substrate of the smart card shown in FIG. 4, wherein parameters related to angles are labeled.
Figure 7B:
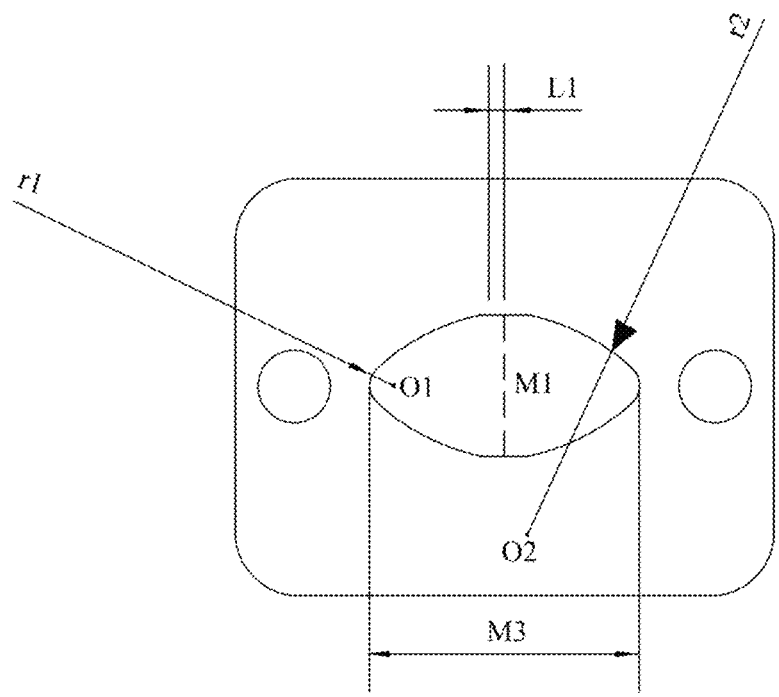
FIG. 7B is a partial top view of the card substrate of the smart card shown in FIG. 4, wherein the parameters related to distances are labeled.

Referring to FIGS. 7A and 7B, define the insertion direction of the smart card as the left-right direction X, and the direction perpendicular to the insertion direction of the smart card as the up-down direction Y. In the left-right direction X, the size of the second concave portion 15 of the card substrate 10 of the smart card of the present invention gradually narrows from the middle to both sides. In the vertical direction Y, the size of the second concave portion 15 of the card substrate 10 of the smart card of the present invention also gradually narrows from the middle to both sides. The angle R3 formed by a connecting line between the right end point and the upper end point of the outline of the second concave portion 15, and a connecting line between the right end point and the lower end point of the outline of the second concave portion 15 is between 50 degrees and 80 degrees. Similarly, the angle formed by a connecting line between the left end point and the upper end point of the outline of the second concave portion 15, and a connecting line between the left end point and the lower end point of the outline of the second concave portion 15 is also between 50 degrees and 80 degrees.

Assume that the angle formed by a connecting line between the upper end point and the left end point of the outline of the second concave portion 15, and a connecting line between the upper end point and the right end point of the outline of the second concave portion 15 is labelled as R4. Preferably, the angle R4 is between 100 degrees and 130 degrees. Similarly, the angle formed by a connecting line between the lower end point and the left end point of the outline of the second concave portion 15, and the connecting line between the lower end point and the right end point of the outline of the second concave portion 15 is also between 100 degrees and 130 degrees.

Preferably, a ratio of a distance M3 between the left end point and the right end point of the outline of the second concave portion 15 to a distance M1 between the upper end point and the lower end point of the outline of the second concave portion is between 1.2 and 2.5. The distance M3 between the left end point and the right end point of the outline of the second concave portion is between 2.5 mm and 7.5 mm. The distance M1 between the upper end point and the lower end point of the outline of the second concave portion is between 2.5 mm and 5 mm.

The outline of the second concave portion 15 of the present invention is similar to two opposite triangles, and when the chip module 20 is assembled into the card substrate 10 of this embodiment, it can provide good support and protection for the chip. Even when the three-roller 30 test is performed, the chip will not absorb too much vibration and extrusion, which helps to improve the passing rate of the reliability test of the chip.

Specifically, in the embodiment shown in FIGS. 7A and 7B, the outline of the first concave portion 14 of the card substrate 10 is substantially rectangular and includes four first straight sections 140 connected end to end. Preferably, the outline of the first concave portion 14 further includes arc-shaped first connecting sections 141 for connecting adjacent first straight sections 140.

In this embodiment, the outline of the second concave portion 15 of the card substrate 10 is approximately rugby ball-shaped, including two symmetrical curved sections 150 arranged along the left-right direction X and connected to each other. The curved section 150 includes a first arc-shaped section 152 approximately in the middle, two second arc-shaped sections 153 respectively connected to both ends of the first arc-shaped section 152, and two straight sections 154 respectively connected to the ends of the two second arc-shaped sections 153 away from the first arc-shaped section 152. One second straight section 154 of each curved section 150 is connected to a corresponding second straight section 154 of another curved section 150. In other embodiments, the two curved sections 150 may also be asymmetrical in the left-right direction X.

In this embodiment, the middle points of the two first arc-shaped sections 152 are respectively the left end point and the right end point of the outline of the second concave portion 15. Any point on the upper second straight section 154 is the upper end point of the outline of the second concave portion 15. Any point on the lower second straight section 154 is the lower end point of the outline of the second concave portion 15.

Preferably, the central angle R1 corresponding to the first arc-shaped section 152 is between 81 degrees and 134 degrees. The radius r1 of the first arc-shaped section 152 is between 0.4 mm and 1 mm. Preferably, the central angle R2 of the second arc-shaped section 153 is between 16 degrees and 40 degrees. The radius r2 of the second arc-shaped section 153 is between 3 mm and 7 mm.

It can be seen that the outline of the second concave portion 15 of this embodiment includes six arc-shaped sections (two first arc-shaped sections 152 and four second arc-shaped sections 153) and two straight-line segments (each straight segment includes two second straight sections 154). It should be noted that the number and arrangement of the arc-shaped sections and the straight sections in this embodiment are only shown as examples. In other embodiments, other numbers and arrangements of the arc-shaped sections and the straight sections can be used. For example, in other embodiments, the outline of the second concave portion may only be formed by connecting multiple arc-shaped sections, or the above-mentioned first arc-shaped section 152 and the second arc-shaped section 153 may respectively be composed of multiple arcs. Alternatively, in some embodiments, the outline of the second concave portion may be composed of multiple arc-shaped sections and multiple straight sections, wherein the multiple arc-shaped sections may be connected sequentially, and the multiple straight sections may be sequentially connected and then connected with two ends of the aforementioned sequentially connected multiple arc-shaped sections, or multiple arc-shaped sections and multiple straight sections can be arranged and connected periodically at intervals, or, the multiple arc-shaped sections and the multiple straight sections can be randomly connected and arranged, as long as the final formed second concave portion can use its specific shape to well support and protect the chip module.

Figure 8:
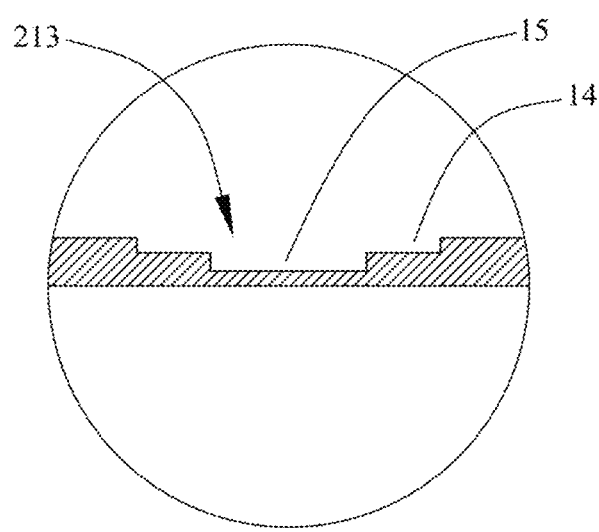
FIG. 8 is a partial sectional view of a card substrate of a smart card of a second embodiment of the present invention.

Referring to FIG. 8, the smart card of the second embodiment of the present invention is similar to the smart card of the first embodiment, and the similarities will not be repeated here. The main difference between the smart card of the second embodiment and the smart card of the first embodiment is that the smart card in this embodiment is a contact smart card, and the concave portion 213 in the second embodiment does not include the aforementioned third concave portion 16.

Figure 9:
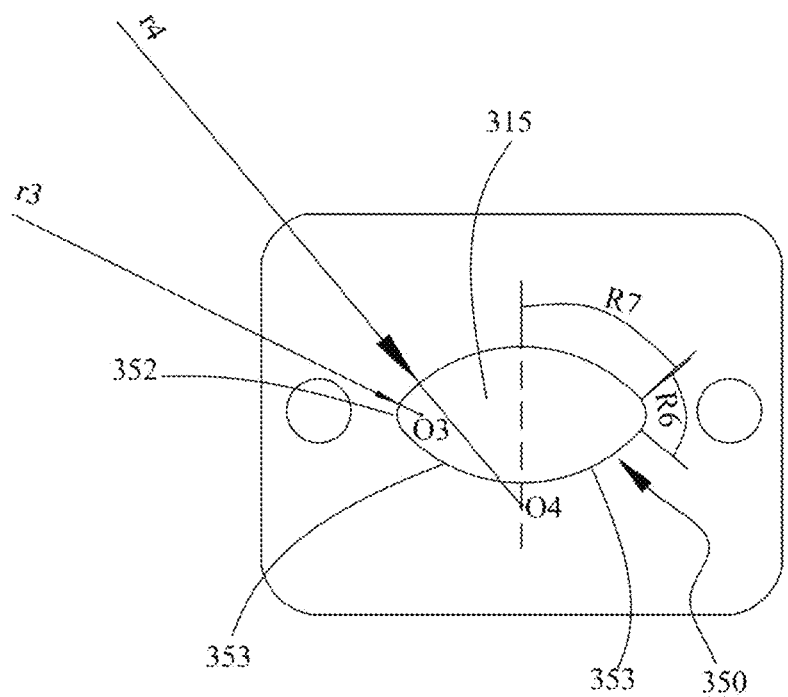
FIG. 9 is a partial top view of a card substrate of a smart card of a third embodiment of the present invention.

Referring to FIG. 9, the smart card of the third embodiment of the present invention is similar to the smart card of the first embodiment, and the similarities will not be repeated here. The main difference between the smart card of the third embodiment and the smart card of the first embodiment is that the outline of the second concave portion is slightly different.

Specifically, the curved section 350 of the outline of the second concave portion 315 in this embodiment no longer includes the second straight section 154, but only includes the first arc-shaped section 352 approximately in the middle, and two second arc-shaped sections 353 respectively connected to two ends of the first arc-shaped section 352. A second arc-shaped section 353 of each curved section 350 is directly connected to a corresponding second arc-shaped section 353 of another curved section 350. Preferably, the two curved sections 350 are symmetrical in the left-right direction.

Preferably, the central angle R6 corresponding to the first arc-shaped section 352 is between 81 degrees and 134 degrees. The radius r3 corresponding to the first arc-shaped section 352 is between 0.4 mm and 1 mm. Preferably, the central angle R7 corresponding to the second arc-shaped section 353 is between 16 degrees and 40 degrees. The radius r4 corresponding to the second arc-shaped section 353 is between 3 mm and 7 mm. Two adjacent second arc-shaped sections 353 may be on the same circumference, or on different circumferences. When two adjacent second arc-shaped sections 353 are on the same circumference, the two second arc-shaped sections 353 can also be combined as one circular arc.

Figure 10:
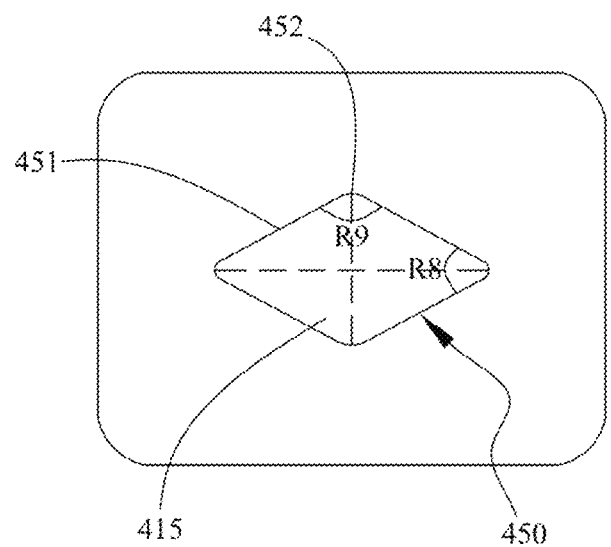
FIG. 10 is a partial top view of a card substrate of a smart card of a fourth embodiment of the present invention.

Referring to FIG. 10, the smart card of the fourth embodiment of the present invention is similar to the smart card of the first embodiment, and the similarities will not be repeated here. The main difference between the smart card of the fourth embodiment and the smart card of the first embodiment is that the outline of the second concave portion is different.

Specifically, the curved section 450 of the second concave portion 415 of this embodiment includes two third straight sections 451. The two curved sections 450 together form a substantially rhombic outline. The outline of the second concave portion 415 in this embodiment further includes arc-shaped second connecting sections 452 for connecting adjacent third straight sections 451.

Preferably, a first angle R8 is formed between two third straight sections 451 of each curved section 450, and the first angle R8 is between 50 degrees and 80 degrees. A second angle R9 is formed between two adjacent third straight sections 451 of the two curved sections 450, and the second angle R9 is between 100 degrees and 130 degrees. Understandably, in other embodiments, the outline of the second concave portion 415 may not be rhombus, but a quadrilateral formed by two asymmetric triangles. For example, the two curved sections 450 may have different first angles R8.

The above are only preferred embodiments of the present invention, and the protection scope of the present invention is not limited to the above-listed examples. Any person skilled in the art can obviously obtain the technology within the technical scope disclosed in the present invention. Simple changes or equivalent replacements of the solutions fall within the protection scope of the present invention.

The invention claimed is:

1. A card substrate for carrying a chip module, the card substrate comprising a first surface and a second surface opposite to the first surface, and a concave portion recessed from the first surface toward the second surface for accommodating the chip module, the concave portion comprising a first concave portion recessed from the first surface toward the second surface, and a second concave portion further recessed from a bottom wall of the first concave portion toward the second surface, characterized in that, the second concave portion accommodates and supports a chip of the chip module, in a left-right direction, a size of the second concave portion narrows from a middle to both sides, and in an up-down direction, a size of the second concave portion narrows from the middle to both sides, a first angle formed by a connecting line between a right end point and a upper end point of an outline of the second concave portion, and a connecting line between the right end point and a lower end point of the outline of the second concave portion is between 50 degrees and 80 degrees, a second angle formed by a connecting line between a left end point and the upper end point of the outline of the second concave portion, and a connecting line between the left end point and the lower end point of the outline of the second concave portion is also between 50 degrees and 80 degrees.

2. The card substrate for carrying a chip module according to claim 1, characterized in that, a third angle is formed by a connecting line between the upper end point and the left end point of the outline of the second concave portion, and the connecting line between the upper end point and the right end point of the outline of the second concave portion, and the third angle is between 100 degrees and 130 degrees.

3. The card substrate for carrying a chip module according to claim 1, characterized in that, a ratio of a distance between the left end point and the right end point of the outline of the second concave portion to a distance between the upper end point and the lower end point of the outline of the second concave portion is between 1.2 and 2.5.

4. The card substrate for carrying a chip module according to claim 1, characterized in that, the outline of the second concave portion comprises two curved sections arranged along the left-right direction and connected with each other, each curved section comprises a first arc-shaped section in a middle of the curved section, and two second arc-shaped sections respectively connected to two ends of the first arc-shaped section.

5. The card substrate for carrying a chip module according to claim 4, characterized in that, a central angle corresponding to the first arc-shaped section is between 81 degrees and 134 degrees, and a radius corresponding to the first arc-shaped section is between 0.4 mm and 1 mm.

6. The card substrate for carrying a chip module according to claim 4, characterized in that, a central angle corresponding to the second arc-shaped section is between 16 degrees and 40 degrees, and a radius corresponding to the second arc-shaped section is between 3 mm and 7 mm.

7. The card substrate for carrying a chip module according to claim 4, characterized in that, the curved section further comprise two straight sections respectively connected to ends of the two second arc-shaped sections away from the first arc-shaped section.

8. The card substrate for carrying a chip module according to claim 1, characterized in that, a distance between the left end point and the right end point of the outline of the second concave portion is between 2.5 mm and 7.5 mm, and a distance between the upper end point and the lower end point of the outline of the second concave portion is between 2.5 mm and 5 mm.

9. The card substrate for carrying a chip module according to claim 1, characterized in that, the outline of the second concave portion comprises two curved sections arranged along the left-right direction and connected with each other, the two curved sections together form a quadrilateral, each curved section comprises two straight sections, and the outline further comprises arc-shaped connecting sections for connecting adjacent straight sections.

10. The card substrate for carrying a chip module according to claim 1, characterized in that, the outline of the second concave portion is rhombus-shaped.

11. The card substrate for carrying a chip module according to claim 1, characterized in that, the outline of the second concave portion is rugby ball-shaped.

12. A smart card, characterized in that, the smart card comprises the card substrate according to claim 1, and a chip module accommodated in the concave portion of the card substrate.

13. A card substrate for carrying a chip module, the card substrate comprising a first surface and a second surface opposite to the first surface, and a concave portion recessed from the first surface toward the second surface for accommodating the chip module, the concave portion comprising a first concave portion recessed from the first surface toward the second surface, and a second concave portion further recessed from a bottom wall of the first concave portion toward the second surface, characterized in that, in a left-right direction, a size of the second concave portion narrows from a middle to both sides, and in an up-down direction, a size of the second concave portion narrows from the middle to both sides, a first angle formed by a connecting line between a right end point and a upper end point of an outline of the second concave portion, and a connecting line between the right end point and a lower end point of the outline of the second concave portion is between 50 degrees and 80 degrees, a second angle formed by a connecting line between a left end point and the upper end point of the outline of the second concave portion, and a connecting line between the left end point and the lower end point of the outline of the second concave portion is also between 50 degrees and 80 degrees, the card substrate is further formed with two third concave portions which further recess from the bottom wall of the first concave portion toward the second surface of the card substrate.

14. The card substrate for carrying a chip module according to claim 13, the two third concave portions are respectively located at both ends of the second concave portion along the insertion direction of the smart card.

15. The card substrate for carrying a chip module according to claim 13, the two third concave portions contain conductive material.

* * * * *